(12) United States Patent
Zhou et al.

(10) Patent No.: US 12,382,603 B2
(45) Date of Patent: Aug. 5, 2025

(54) HEAT DISSIPATION DEVICE AND ELECTRONIC EQUIPMENT HAVING THE HEAT DISSIPATION DEVICE

(71) Applicant: Fulian Precision Electronics (Tianjin) Co., LTD., Tianjin (CN)

(72) Inventors: San-Long Zhou, Tianjin (CN); Gong-Wen Zhang, Tianjin (CN); Yang Li, Tianjin (CN); Jun Li, Shenzhen (CN); Jun Chen, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 342 days.

(21) Appl. No.: 18/123,150

(22) Filed: Mar. 17, 2023

(65) Prior Publication Data

US 2023/0328916 A1  Oct. 12, 2023

(30) Foreign Application Priority Data

Apr. 8, 2022  (CN) .......................... 202210370191.5

(51) Int. Cl.
  *H05K 7/20* (2006.01)
  *G06F 1/20* (2006.01)

(52) U.S. Cl.
  CPC ......... *H05K 7/20145* (2013.01); *G06F 1/203* (2013.01); *H05K 7/20154* (2013.01)

(58) Field of Classification Search
  CPC . G06F 1/20; G06F 1/181; G06F 1/183; G06F 2200/201; G06F 1/188; G06F 1/26; H05K 7/20145; H05K 1/0203; H05K 7/20718; H05K 7/1492; H05K 7/20554; H05K 7/20; H05K 7/20136; H05K 7/20181; H05K 7/20909; H05K 7/20772; H05K 7/20709

USPC .............. 361/695, 679.49, 679.54, 694, 697, 361/679.48, 690, 679.5, 679.51, 688; 165/80.3, 104.33

See application file for complete search history.

(56) References Cited

U.S. PATENT DOCUMENTS

| | | | |
|---|---|---|---|
| 6,094,345 A * | 7/2000 | Diemunsch | H05K 7/20727 361/691 |
| 7,108,051 B2 * | 9/2006 | Hung | H01L 23/467 361/679.48 |
| 7,990,706 B2 * | 8/2011 | Miyahara | H01L 23/467 361/679.48 |

(Continued)

FOREIGN PATENT DOCUMENTS

| | | | |
|---|---|---|---|
| CN | 107463234 A | 12/2017 | |
| GB | 2561988 A * | 10/2018 | G06F 1/20 |
| TW | M614232 U | 7/2021 | |

OTHER PUBLICATIONS

GB 2561988 translation plus original (Year: 2017).*

*Primary Examiner* — Mandeep S Buttar
(74) *Attorney, Agent, or Firm* — ScienBiziP, P.C.

(57) ABSTRACT

A heat dissipation device includes an air-guiding housing and a heat sink assembly. An air guiding channel running through in a first direction is defined by the air-guiding housing, an air outlet of the air guiding channel is configured to provide cooling air to at least one power supply unit. The air-guiding housing comprises a mounting surface located at an end of the air-guiding housing in a second direction, the first direction is perpendicular to the second direction. An electronic equipment having the heat dissipation device is also provided.

14 Claims, 6 Drawing Sheets

(56) References Cited

U.S. PATENT DOCUMENTS

| | | | | |
|---|---|---|---|---|
| 9,075,581 B2* | 7/2015 | Stock | ............... | H05K 7/20727 |
| 10,602,639 B2* | 3/2020 | Chang | ............... | G06F 1/20 |
| 2005/0041392 A1* | 2/2005 | Chen | ............... | H05K 7/20727 |
| | | | | 361/695 |
| 2012/0153094 A1* | 6/2012 | Oosawa | ............... | H05K 7/1447 |
| | | | | 248/68.1 |
| 2013/0155606 A1* | 6/2013 | Sasaki | ............... | H01L 23/467 |
| | | | | 361/679.47 |

* cited by examiner

HEAT DISSIPATION DEVICE AND ELECTRONIC EQUIPMENT HAVING THE HEAT DISSIPATION DEVICE

FIELD

The subject matter herein generally relates to a technical field of heat dissipation, in particular to a heat dissipation device and an electronic equipment having the heat dissipation device.

BACKGROUND

With the development of new technologies such as cloud computing and big data, the requirements for computing power of servers are becoming higher, and the internal components of server chassis are becoming denser. Moreover, as the computing speed and amount of computing of the processor increase, heat production of components such as memory, hard disk, and CPU (Central Processing Unit) also increases. Therefore, how to dissipate heat from the PSU (Power Supply Unit) under the condition of limited space of server chassis is a problem to be solved at present.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

An embodiment of a heat dissipation device is provided. The heat dissipation device includes an air-guiding housing and a heat sink assembly. An air guiding channel is defined by the air-guiding housing, and the air guiding channel runs through the air-guiding housing in a first direction. An air outlet of the air guiding channel is used to provide cooling air for a power supply unit (shorted as PSU). The air-guiding housing further includes a mounting surface located at one end of the air-guiding housing in a second direction. One end of the heat sink assembly is connected to the mounting surface, and the other end of the heat sink assembly is used for connecting to the central processing unit (shorted as CPU) and cooling the CPU. The first direction is perpendicular to the second direction.

When a fan module is started, cooling air enters the air guiding channel of the heat dissipation device from an air inlet of the air guiding channel, and then enters the PSU from the outlet of the air guiding channel to cool the PSU. The heat dissipation device can be integrated with an air duct of the PSU, so that without increasing the number of the fan modules in the chassis, the limited space inside the chassis can be fully utilized, the existing air volume can be reasonably distributed. As a result, the heat dissipation effect can be improved, the density of components inside the chassis can be avoided to increase, and the cost can be effectively reduced.

Figure 1:
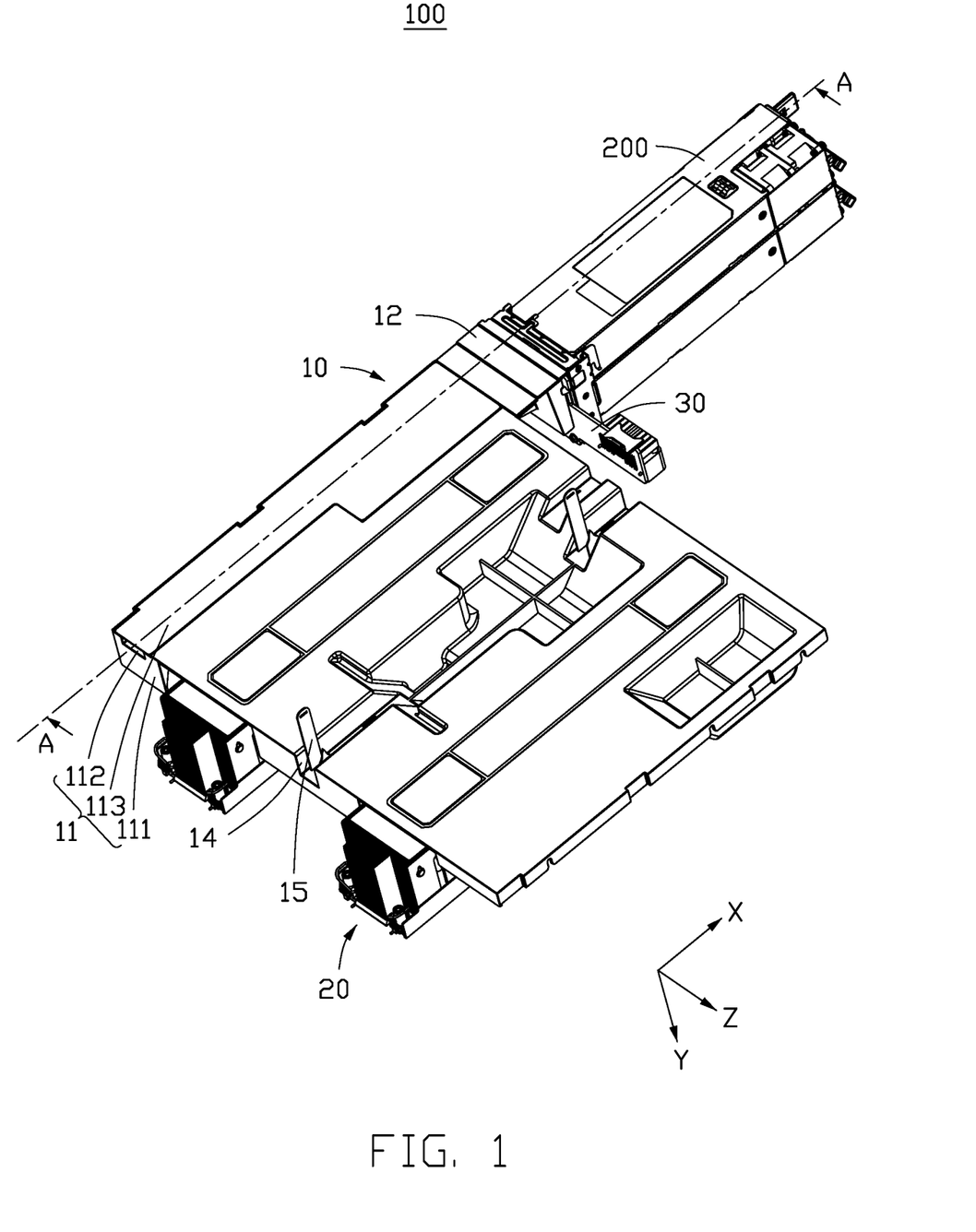
FIG. 1 is a diagram of an embodiment of a heat dissipation device according to the present disclosure.

FIG. 1 illustrates an embodiment of a heat dissipation device 100. Referring to FIGS. 1, 2, 3 and 4, the heat dissipation device 100 includes an air-guiding housing 10 and a heat sink assembly 20. An air guiding channel 13 is defined by the air-guiding housing 10, and the air guiding channel 13 runs through the air-guiding housing 10 in a first direction X. An air outlet of the air guiding channel 13 is used to communicate with a PSU 200, the cooling air flows along the air guiding channel 13 to the PSU 200 and cools the PSU 200. The air-guiding housing 10 further includes a mounting surface located at one end of the air-guiding housing 10 in a second direction Y. One end of the heat sink assembly 20 is connected to the mounting surface, and the other end of the heat sink assembly 20 is used for connecting at least one component and cooling the component. The first direction X is perpendicular to the second direction Y.

The component may be a memory, a hard disk or a CPU. In at least one embodiment, the component is a CPU.

In at least one embodiment, the air outlet of the air guiding channel 13 may be connected to other components except the PSU 200 to cool the components. The size and the shape of the air outlet of the air guiding channel 13 match the size, the number and the shape of the heat dissipation channels of the components connected to the air guiding channel 13.

The air guiding channel 13 extends along the first direction X means the air guiding channel 13 has an extension in the first direction X, so that the cooling air can enter from one end of the air-guiding housing 10 in the first direction X, flow along the air guiding channel 13, and then flow out from the other end of the air-guiding housing 10 in the first direction X. the actual extension of the air guiding channel 13 may be S-shaped or other irregular shapes, it only needs to be able to guide the cooling air from one end of the air-guiding housing 10 in the first direction X to the other end of the air-guiding housing 10 in the first direction X.

When the fan module is started, the cooling air enters the air guiding channel 13 from an air inlet of the air guiding channel 13, and then enters the PSU 200 from the outlet of the air guiding channel 13 to cool the PSU 200. The heat dissipation device 100 can be integrated with an air duct of the PSU 200, so that without increasing the number of the fan modules in the chassis, the limited space inside the chassis can be fully utilized, the existing air volume can be reasonably distributed. As a result, the heat dissipation effect can be improved, the density of components inside the chassis can be avoided to increase, and the cost can be effectively reduced.

In at least one embodiment, the air outlet of the air-guiding housing 10 may be provided with a connecting member 30 for detachably connecting the air-guiding housing 10 and the PSU 200.

Preferably, the connecting member 30 may be a sealing part, which can reduce the leakage of the cooling air at the joint between the air-guiding housing 10 and the PSU 200, and then not reduce the cooling air entering the PSU 200 to dissipate heat of the PSU 200, thereby improving the heat dissipation capability of the air guiding channel 13 on the PSU 200. The sealing part may be a rubber mat, a nylon mat or other components that increase sealing.

Figure 2:
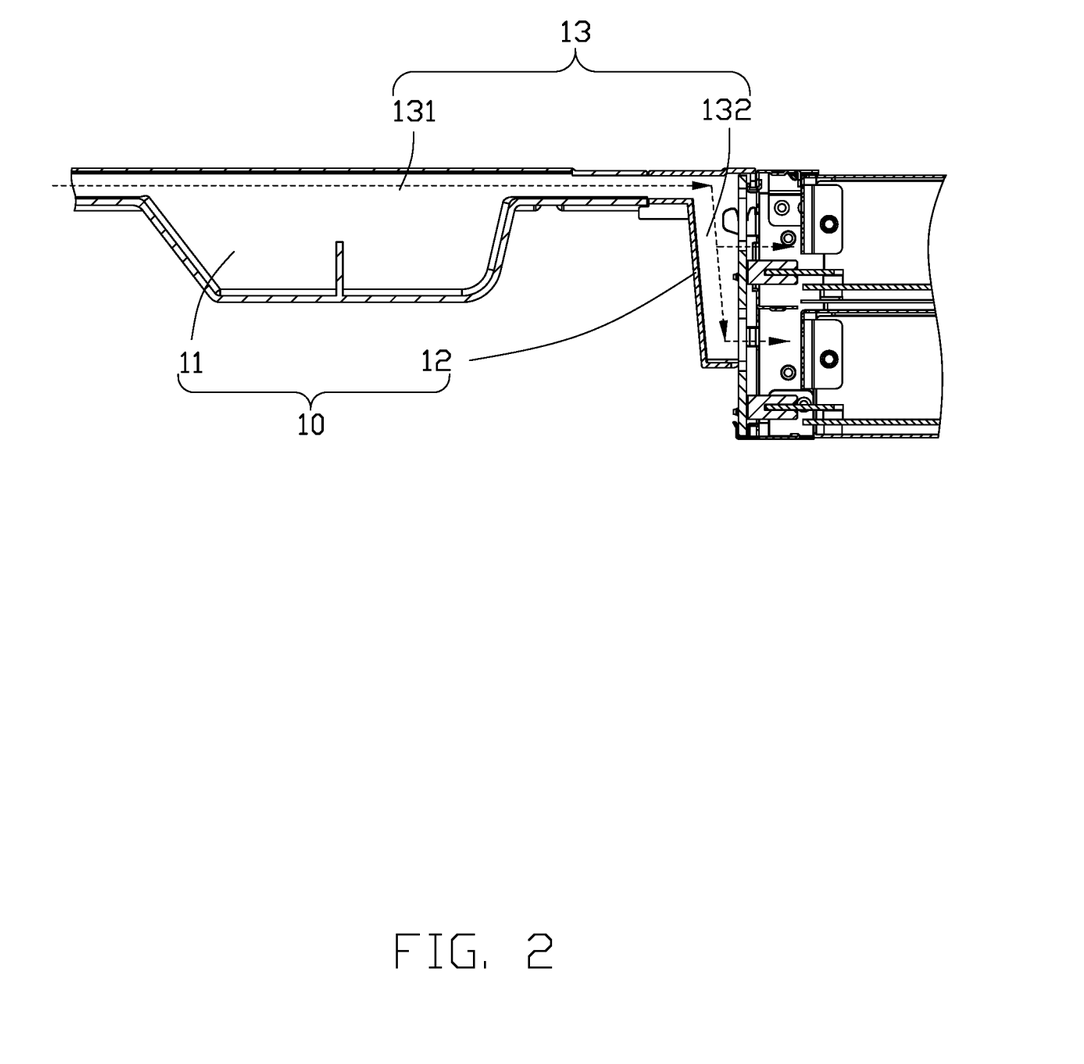
FIG. 2 is a cross-sectional view of the heat dissipation device taken along A-A line of FIG. 1.

In at least one embodiment, the air-guiding housing 10 includes a first shield 11 and a second shield 12. The first shield 11 and the second shield 12 are connected along the first direction X. A first guiding channel 131 is defined by the first shield 11, a second guiding channel 132 is defined by the second shield 12. The first guiding channel 131 and the second guiding channel 132 communicate to form the air guiding channel 13. An air outlet of the second guiding channel 132 is used to communicate with a PSU 200. The air-guiding housing 10 is formed by connecting the first shield 11 and the second shield 12, so that the first shield 11 and the second shield 12 can be processed respectively and also can be disassembled for maintenance. The first shield 11 and the second shield 12 may be connected by means of bolts, buckles, magnetic attraction, welding or gluing.

In at least one embodiment, the second shield 12 has a first end and a second end facing away from the first end. The first end and the second end are spaced in the first direction X. The first end of the second shield 12 communicates with the first shield 11, and the second end of the second shield 12 communicates with the PSU 200. The cooling air enters the PSU 200 through the second end of the second shield 12 to cool the PSU 200.

In at least one embodiment, two PSUs 200 arranged side by side along the second direction Y may be connected to the second end of the second shield 12. The air outlet of the second end of the second shield 12 may include two openings, each of the openings corresponds to one of the PSUs 200, so that the second end of the second shield 12 can be adapted to the air inlets of the PSUs 200 at the same time. In at least one embodiment, the air outlet of the second end of the second shield 12 may communicate with other numbers or arrangements of the PSUs 200. The shape of the air outlet of the second end of the second shield 12 matches the shape of the corresponding air inlet of the component to be cooled, so that the air guiding channel 13 can cool all the PSUs 200 involved.

In at least one embodiment, the connection between the first shield 11 and the second shield 12 may be a sealed connection, so that the leakage of the cooling air entering the second guiding channel 132 at the connection can be reduced, which is beneficial to improve the heat dissipation effect of the air guiding channel 13 on the PSU 200.

Specifically, a sealing member may be provided at the connection between the first shield 11 and the second shield 12, such as a rubber mat, a nylon mat, or other components that increase sealing.

In at least one embodiment, the first shield 11 may include a main body 111 and a cover plate 113. A groove 112 is defined along the first direction X by the main body 111. The cover plate 113 covers the groove 12, and the cover plate 113 cooperates with the groove 112 to form the first guiding channel 131, which facilitates the processing of the first guiding channel 131, especially when a length of the first guiding channel 131 along the first direction X is long, the processing difficulty of the first guiding channel 131 can be reduced.

In at least one embodiment, the cover plate 113 is detachably mounted on the groove 112 to form the first guiding channel 131. In at least one embodiment, hinge portions are arranged on the main body 111, and hinged fitting portions are arranged on the cover plate 113. The cover plate 113 is connected with the main body 111 through the hinge portions and the hinged fitting portions being hinged. Of course, the cover plate 113 may be fixed on the main body 111 to form the first guiding channel 131 by clamping, screwing, or magnetic attraction.

The cover plate 113 completely covers all of an opening of the groove 112 on the main body 111, compared with the cover plate 113 arranged in the groove 112, a cross-sectional dimension of the first guiding channel 131 along a direction perpendicular to the first direction X can be increased, and the amount of air entering the first guiding channel 131 can be increased. So that the heat dissipation effect of the PSU 200 may be improved.

In at least on embodiment, the main body 111 and the second shield 12 may be integrally formed. On the one hand, it can reduce mold opening and reduce costs. On the other hand, it can avoid the leakage of the cooling air at the joint between the main body 111 and the second shield 12, and improve the heat dissipation effect of the PSU 200.

In at least one embodiment, a wiring slot 14 extends through the main body 111 along the first direction X, so that the wiring slot 14 is arranged substantially parallel to the first guiding channel 131. A cross-sectional dimension of the wiring slot 14 along a direction perpendicular to the first direction X is larger than the cross-sectional dimension of the first guiding channel 131. When a part of the cooling air of the fan module passes through the wiring slot 14, cables in the wiring slot 14 can be cooled and prevented from overheating and aging. On the other hand, the cables are pulled from one end of the main body 111 to the other end through the wiring slot 14, which can prevent the cables from resting on hardware device such as server motherboard, so that the problems such as cable overheating and aging and electromagnetic crosstalk can be reduced.

In at least one embodiment, at least one fixing piece 15 may be arranged in the wiring slot 14, and the fixing piece 15 is used for fixing at least one cable tie. The cable tie is used to bind the cables in the wiring slot 14, so as to prevent the cables from being too messy. In at least one embodiment, there are two fixing pieces 15, and the fixing pieces 15 are respectively arranged at opposite ends of the wiring slot 14 along the first direction X. The movement of the cables can be limited by fixing the cable ties on the fixing pieces 15.

In at least one embodiment, in order to cover the cables and prevent the cables from being exposed, the first shield 11 may further include a wiring cover covering the wiring slot 14.

In at least one embodiment, hinged parts may be arranged on the main body 111, and hinged fitting parts may be arranged on the wiring cover, the hinged parts cooperate with the hinged fitting parts to fix the wiring cover on the main body 111. In at least one embodiment, the wiring cover may be pressed by the chassis without detaching from the main body 111.

In at least one embodiment, the wiring cover may be fixed on the main body 111 by clamping or screwing.

In order to prevent crosstalk between multiple cables arranged in one wiring slot 14, a plurality of wiring slots 14 and a plurality of wiring covers may be formed on the first shield 11.

Figure 3:
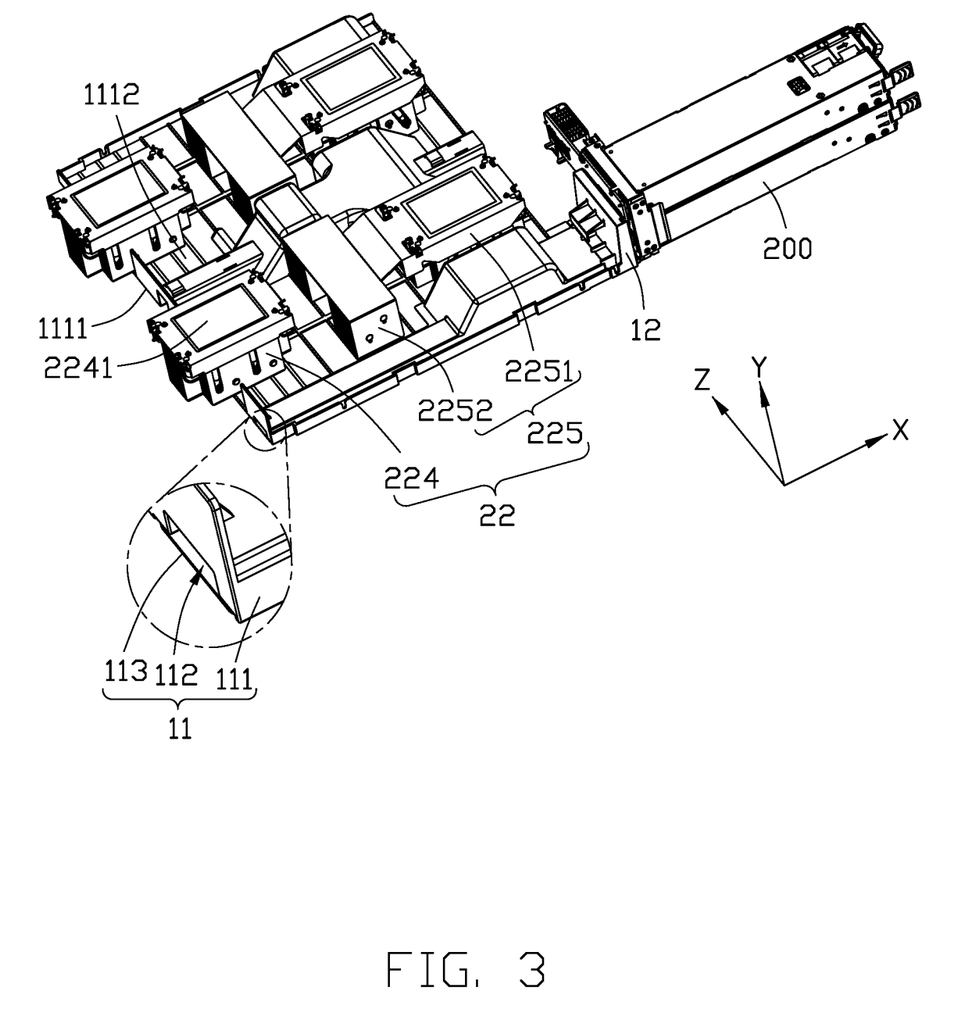
FIG. 3 is a diagram of an embodiment of a first shield of the heat dissipation device of FIG. 1.

Referring to FIGS. 1 and 3, the heat sink assembly 20 may include a plurality of heat sinks 22, and each of the heat sinks 22 is arranged corresponding to one of the CPUs to cool the CPU. One end of the heat sinks 22 is used to contact the CPU for cool the CPU. The air-guiding housing 10 is arranged on the other end of the heat sinks 22 and the air-guiding housing 10 covers the heat sinks 22. In at least one embodiment, the heat sinks 22 may be completely wrapped by the air-guiding housing 10.

In at least one embodiment, the heat sink assembly 20 includes four heat sinks 22. The main body 111 includes a first surface 1111 and a mounting surface 1112 facing away from the first surface 1111 in the second direction Y. The four heat sinks 22 are arranged on the mounting surface 1112. The second direction Y is perpendicular to a plane where the main body 111 is located.

In at least one embodiment, the number of the heat sinks 22 may be varied according to the number of the CPUs, for example, two.

In at least one embodiment, the air guiding channel 13 is defined by the first surface 1111. The air guiding channel 13 and the heat sinks 22 are respectively arranged on opposite sides of the main body 111, so as to facilitate rational utilization of space.

In at least one embodiment, the wiring slot 14 is defined by the first surface 1111, the wiring slot 14 and the heat sinks 22 are respectively arranged on opposite sides of the main body 111, so as to facilitate rational utilization of space.

Figure 4:
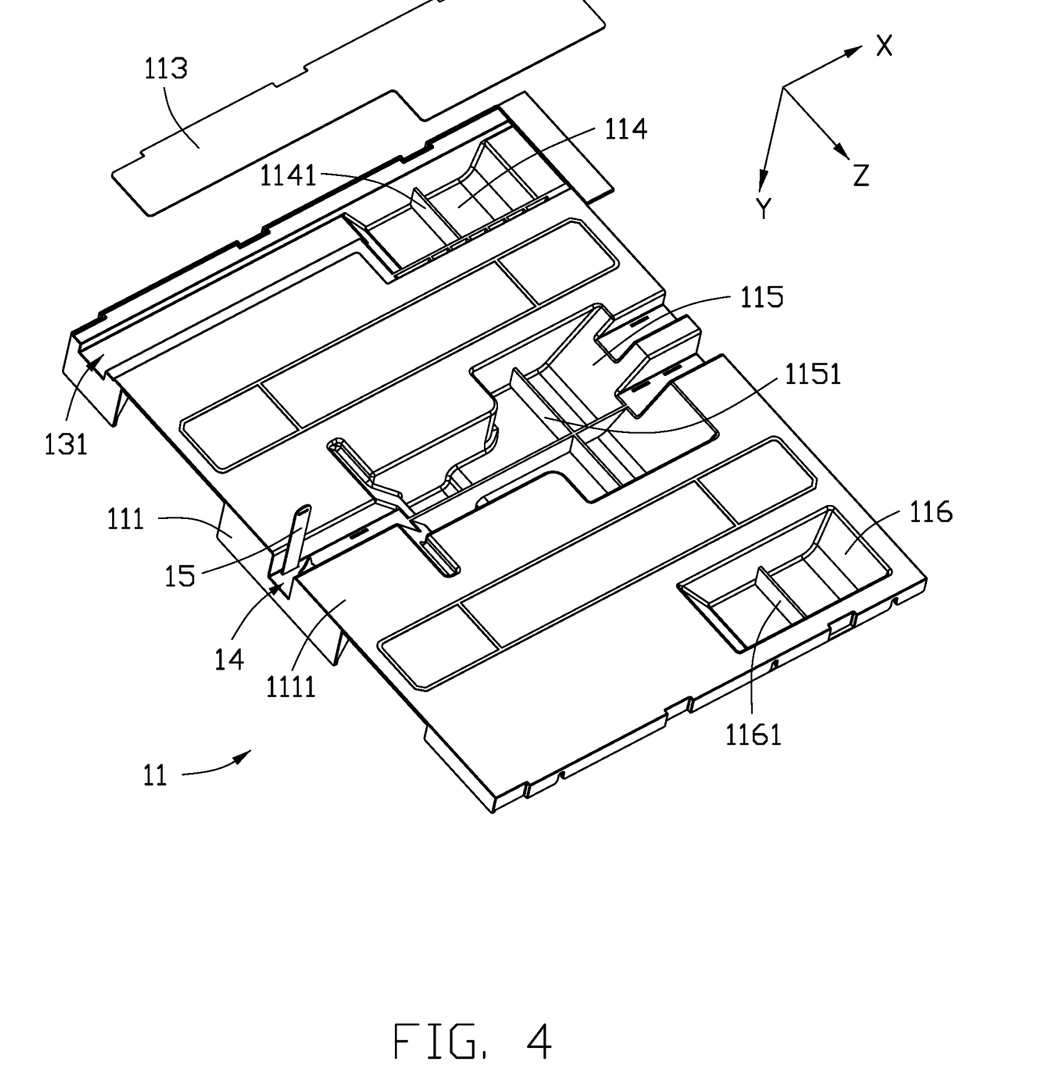
FIG. 4 is a diagram from another angle of the first shield of FIG. 3.

Referring to FIG. 4, the heat sink 22 may include a base, at least one radiating fin, and at least one heat pipe. The base is a heat conducting member, and the base is used to contact the CPU, which can quickly dissipate the heat of the CPU. The at least one radiating fin is arranged on a side of the base away from the CPU, and the base can dissipate part of the heat through the at least one radiating fin. Specifically, the heat sink 22 includes a plurality of radiating fins, and the plurality of radiating fins are evenly distributed on one side of the base. A plurality of through holes are formed on each of the plurality of radiating fins. The at least one heat pipe is arranged on the side of the base away from the CPU. Each heat pipe includes a first section and a second section continuous with the first section. The first section is connected to the base and the first section extends away from the base. The second section extends along an inner wall of the through holes of the radiating fins. The at least one heat pipe transfers heat to the radiating fin contacting the heat pipe. In at least one embodiment, the number of the heat pipes is four. In at least one embodiment, the number of the heat pipes may be varied.

The heat produced by the CPU is directly transferred to the base, and then the base directly transfers part of the heat to the radiating fins on the one hand, on the other hand, the base transfers another part of the heat to the radiating fins through the heat pipes. So that the heat conduction speed can be improved, and the heat dissipation effect and the heat dissipation efficiency can also be improved.

The base may be made of copper. Heat dissipation materials commonly used are copper and aluminum alloy. Compared with aluminum alloy, copper has better thermal conductivity. The base is made of copper, which can transfer the heat produced by the CPU more quickly. So that the heat transfer speed and the heat dissipation efficiency can be improved.

The radiating fins may be made of aluminum alloy. Compared with aluminum alloy, copper is more expensive and more difficult to process. The radiating fins made of aluminum alloy can save cost and is easy to process.

The heat pipe may be a sintered heat pipe. When the heat pipe is bent, the thermal conductivity of the grooved heat pipe is reduced, or even only half of the original thermal conductivity, while the sintered heat pipe has better thermal conductivity. So that the heat sink 22 has a better heat conduction effect due to the sintered heat pipe.

Referring to FIG. 3, the heat sink 22 arranged along the first direction X are a first heat sink 224 and a second heat sink 225. The first seat sink 224 includes a first portion 2241. The second heat sink 225 includes a second portion 2251 and a third portion 2252. The second portion 2251 has a first width S1 in the first direction X, and a structure of the second portion 2251 is substantially the same with a structure of the first portion 2241. The third portion 2252 has a second width S2 in the first direction X, and S1 is less than S2, so that a size of an inlet of the second heat sink 225 is greater than a size of an inlet of the first heat sink 224, a mount of air entering the second heat sink 225 is greater.

In at least one embodiment, the second portion 2251 and the third portion 2252 may be connected in a T shape. The second heat sink 225 may be T-shaped, compared to the first heat sink 224, the second heat sink 225 has the third portion 2252 for heat dissipation, so that the heat dissipation effect of the second heat sink 225 is better than that of the first heat sink 224.

When the wind of the fan module circulates along the first direction X, the wind first enters the first heat sink 224, flows through the first heat sink 224 and then enters the second heat sink 225. The cooling air entering the first heat sink 224 has a first temperature T1, the cooling air entering the second heat sink 225 after passing through the first heat sink 224 has a second temperature T2, and the first temperature T1 is less than the second temperature T2. If the structure of the first heat sink 224 and the structure of the second heat sink 225 are exactly the same, a cooling effect of the cooling air of the second temperature T2 entering the second heat sink 225 on the CPU is lower than a cooling effect of the cooling air of the first temperature T1 entering the first heat sink 224 on the CPU. The heat dissipation effect of the CPU corresponding to the second heat sink 225 is poor, so that the temperature difference between different CPUs on the motherboard is relatively large. But if the second heat sink 225 is set as a T-shaped heat sink 22, a heat dissipation area of the second heat sink 225 is increased, which can make up for the problem that the cooling air of the second temperature T2 entering the second heat sink 225 is poorer in heat dissipation than the cooling air of the first temperature T1 entering the first heat sink 224, so that the temperatures of different CPUs on the motherboard can be balanced, and the temperature difference between different CPUs can be controlled within 4 degrees Celsius.

Figure 5:
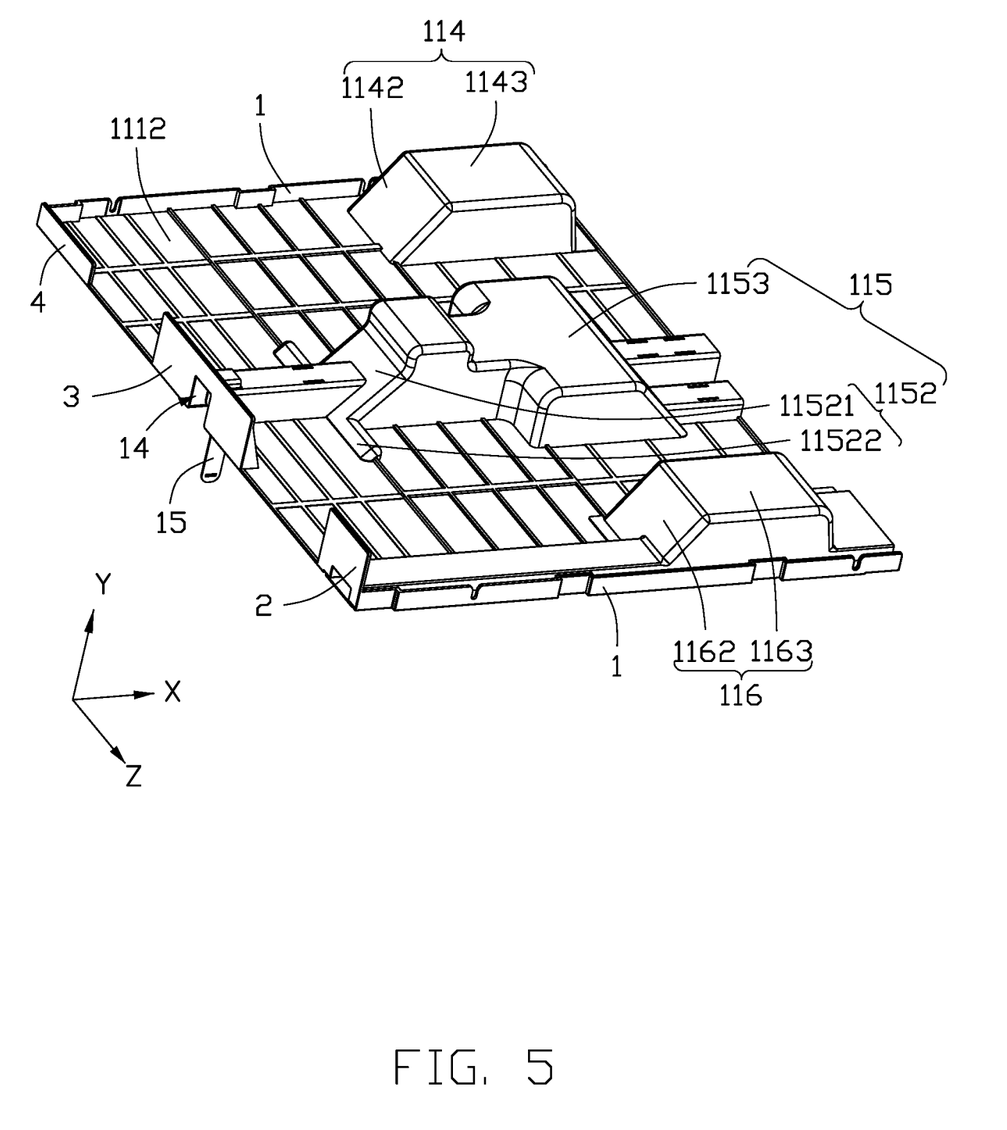
FIG. 5 is a diagram from another angle of the heat dissipation device of FIG. 1.
Figure 6:
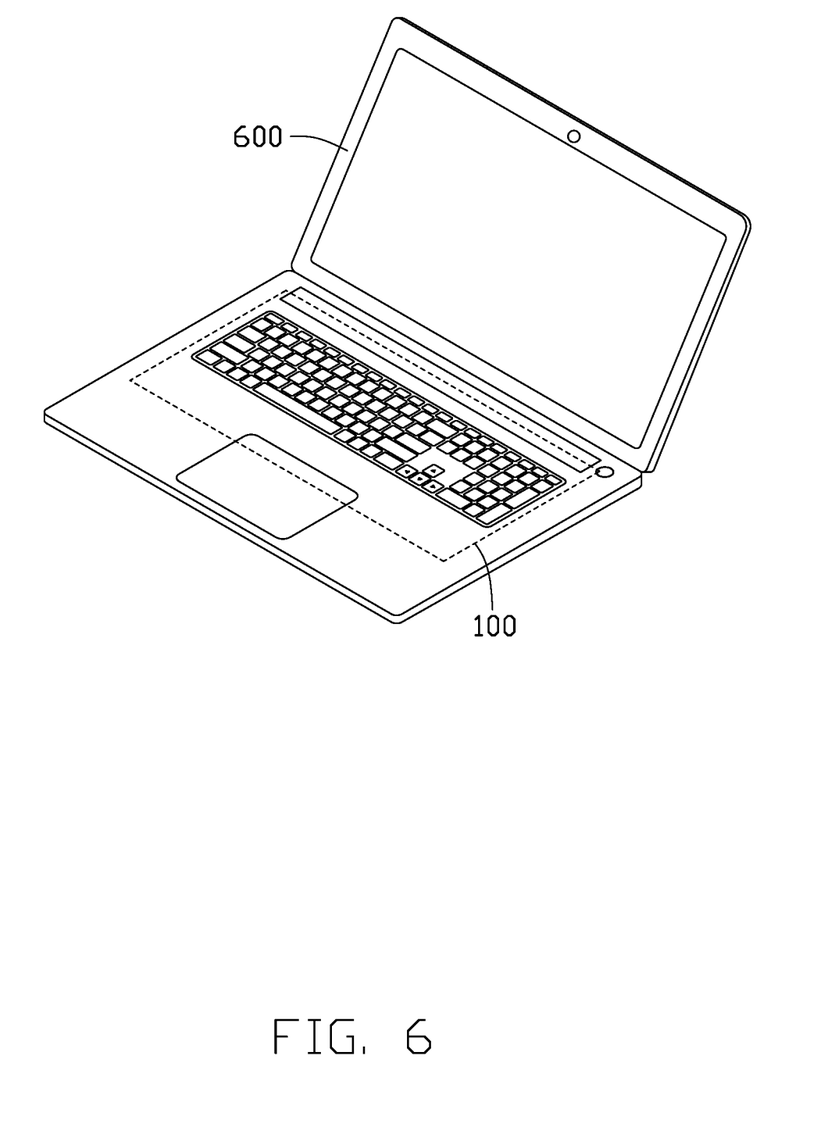
FIG. 6 is a diagram of an embodiment of an electronic equipment according to the present disclosure.

Referring to FIGS. 4 and 5, in at least one embodiment, a windshield assembly may be arranged on the mounting surface 1112. The mounting surface 1112 includes two first windshields 1 arranged at opposite ends of the mounting surface 1112 at intervals along a third direction Z. The windshield 1 extends along the second direction Y from an edge of the mounting surface 1112 to form a channel for cooling air to flow along the first direction X. The third direction Z may be perpendicular to the first direction X and the second direction Y.

The windshield assembly may further include a third windshield 3, a fourth windshield 4, and a second windshield 2. The third windshield 3, the fourth windshield 4, and the second windshield 2 are arranged at intervals along the third direction Z at an end of the first shield 11 away from the second shield 12, that is, on the air inlet side of the first shield 11. One first heat sink 224 is arranged between the third windshield 3 and the fourth windshield 4, and another first heat sink 224 is arranged between the second windshield 2 and the third windshield 3. The third windshield 3, the fourth windshield 4, and the second windshield 2 are used to block cooling wind that does not pass through the first heat sink 224. The second windshield 2 is arranged at the position of the air inlet of the first guiding channel 131, and the second windshield 2 is provided with at least one avoidance hole so that the cooling wind can blow into the first guiding channel 131 smoothly. The third windshield 3 is arranged at one end of the wiring slot 14, and the third windshield 3 is provided with at least one avoidance hole for passage of cables and the cooling wind.

The windshield assembly may further include a first windshield portion 114, a second windshield portion 115, and a third windshield portion 116 arranged at intervals along the third direction Z. One second heat sink 225 is arranged between the first windshield portion 114 and the second windshield portion 115, and another second heat sink 225 is arranged between the second windshield portion 115 and the third windshield portion 116. The first windshield portion 114, the second windshield portion 115, and the third windshield portion 116 may be convex, and the cooling wind is prevented from flowing through the first windshield portion 114, the second windshield portion 115, and the third windshield portion 116, thereby increasing the air volume of the flow passage of the cooling wing.

Viewed along the second direction Y, each of the first windshield portion 114, the second windshield portion 115, and the third windshield portion 116 may have a groove.

In at least one embodiment, a first reinforcing structure 1141 may be arranged in the groove of the first windshield portion 114 to improve the structural stability of the first windshield portion 114.

It can be understood that a second reinforcing structure 1151 may be arranged in the groove of the second windshield portion 115 to improve the structural stability of the second windshield portion 115, and a third reinforcing structure 1161 may be arranged in the groove of the third windshield portion 116 to improve the structural stability of the third windshield portion 116.

Viewed along a direction opposite the second direction Y, the first windshield portion 114, the second windshield portion 115, and the third windshield portion 116 may be convex. The first windshield portion 114 includes a first connecting surface 1143 and a first wind shielding surface 1142. The first connecting surface 1143 may be used to connect memory modules of CPUs such as DIMMs (Dual-Inline-Memory-Modules). An included angle between the first wind shielding surface 1142 and a flow direction of the cooling air is defined as $\alpha$, $\alpha \leq 90°$. In at least one embodiment, $30° \leq \alpha \leq 60°$, within this angle range, a wind resistance can be reduced while the wind is shielded, and the structural stability of the first windshield portion 114 can be improved. The second windshield portion 115 is located at the position of the wiring slot 14 and the second windshield portion 115 is further located between two second heat sinks 225. The second windshield portion 115 includes a second connecting surface 1153 and a second wind shielding surface 1152. The second connecting surface 1153 may be used to connect memory modules of CPUs such as DIMMs. The second wind shielding surface 1152 may include a stopper 11521 and two reinforcements 11522, and the reinforcements 11522 are arranged opposite sides of the wiring slot 14 at intervals along the third direction Z, so that the second wind shielding surface 1152 are T-shaped, and the structural stability of the second windshield portion 115 can be improved. An included angle between the second wind shielding surface 1152 and the flow direction of the cooling air is defined as $\beta$, $\beta \leq 90°$. In at least one embodiment, $30° \leq \beta \leq 60°$, within this angle range, the wind resistance can be reduced while the wind is shielded, and the structural stability of the second windshield portion 115 can be improved. The third windshield portion 116 is located at the position of the first guiding channel 131, and the third windshield portion 116 may include a third connecting surface 1163 and a third wind shielding surface 1162. The third connecting surface 1163 may be used to connect memory modules of CPUs such as DIMMs. An included angle between the third wind shielding surface 1162 and the flow direction of the cooling air is defined as $\gamma$, $\gamma \leq 90°$. In at least one embodiment, $30° \leq \gamma \leq 60°$, within this angle range, the wind resistance can be reduced while the wind is shielded, and the structural stability of the third windshield portion 116 can be improved.

FIG. 5 illustrates an embodiment of an electronic equipment 600. The electronic equipment 600 includes the above heat dissipation device 100. The electronic equipment 600 can integrate the independent air guiding channel 13 with the PSU 200 to solve the problem of tight space inside the electronic equipment.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A heat dissipation device comprising: an air-guiding housing; and a heat sink assembly; wherein an air guiding channel is defined by the air-guiding housing and the air guiding channel runs through the air-guiding housing in a first direction, an air outlet of the air guiding channel is configured to provide cooling air to at least one power supply unit, the air-guiding housing comprises a mounting surface located at an end of the air-guiding housing in a second direction, the first direction is perpendicular to the second direction; wherein the air-guiding housing further comprises a first shield and a second shield, the first shield and the second shield are detachably connected, a first guiding channel is defined by the first shield, a second guiding channel is defined by the second shield, and the first guiding channel second guiding channel communicate to form the air guiding channel; and wherein the first shield comprises a main body and a cover plate, a groove is defined by the main body, the cover plate cooperates with main body to cover the groove to form the first guiding channel.

2. The heat dissipation device of claim 1, wherein the first shield and the second shield are hermetically connected.

3. The heat dissipation device of claim 1, wherein a wiring slot is defined by the air-guiding housing, the wiring slot is parallel to the air guiding channel and the wiring slot penetrates the air-guiding housing.

4. The heat dissipation device of claim 3, wherein two fixing pieces are arranged in the wiring slot, and the fixing pieces are respectively arranged at opposite ends of the wiring slot, the fixing pieces are configured to fix cables in the wiring slot.

5. The heat dissipation device of claim 1, wherein the heat sink assembly comprises a plurality of heat sinks, and two of the plurality of heat sinks are arranged at intervals along the first direction, the two of the plurality of heat sinks comprises a first heat sink and a second heat sink;

the first heat sink comprises a first portion;

the second heat sink comprises a second portion and a third portion, the second portion has a first width in the first direction, the third portion has a second width in the first direction, the second width is greater than the first width, the second portion and the third portion are connected in the first direction;

a structure of the first portion is the same with a structure of the second portion.

6. The heat dissipation device of claim 5, wherein the air-guiding housing further comprises a plurality of windshield portions, the plurality of windshield portions are arranged at intervals in a third direction, the plurality of windshield portions protrudes from the mounting surface, the third direction is perpendicular to the first direction and the second direction respectively.

7. The heat dissipation device of claim 1, wherein the heat dissipation device further comprises a connecting member arranged on the second shield, the connecting member is configured to detachably connect the second shield and the at least one power supply unit.

8. An electronic equipment comprising: a heat dissipation device comprising: an air-guiding housing; and a heat sink assembly; wherein an air guiding channel is defined by the air-guiding housing and the air guiding channel runs through the air-guiding housing in a first direction, an air outlet of the air guiding channel is configured to provide cooling air to at least one power supply unit, the air-guiding housing comprises a mounting surface located at an end of the air-guiding housing in a second direction, the first direction is perpendicular to the second direction; wherein the air-guiding housing further comprises a first shield and a second shield, the first shield and the second shield are detachably connected, a first guiding channel is defined by the first shield, a second guiding channel is defined by the second shield, and the first guiding channel second guiding channel communicate to form the air guiding channel; and wherein the first shield comprises a main body and a cover plate, a groove is defined by the main body, the cover plate cooperates with main body to cover the groove to form the first guiding channel.

9. The electronic equipment of claim 8, wherein the first shield and the second shield are hermetically connected.

10. The electronic equipment of claim 8, wherein a wiring slot is defined by the air-guiding housing, the wiring slot is parallel to the air guiding channel and the wiring slot penetrates the air-guiding housing.

11. The electronic equipment of claim 10, wherein two fixing pieces are arranged in the wiring slot, and the fixing pieces are respectively arranged at opposite ends of the wiring slot, the fixing pieces are configured to fix cables in the wiring slot.

12. The electronic equipment of claim 8, wherein the heat sink assembly comprises a plurality of heat sinks, and two of the plurality of heat sinks are arranged at intervals along the first direction, the two of the plurality of heat sinks comprises a first heat sink and a second heat sink;

the first heat sink comprises a first portion;

the second heat sink comprises a second portion and a third portion, the second portion has a first width in the first direction, the third portion has a second width in the first direction, the second width is greater than the first width, the second portion and the third portion are connected in the first direction;

a structure of the first portion is the same with a structure of the second portion.

13. The electronic equipment of claim 12, wherein the air-guiding housing further comprises a plurality of windshield portions, the plurality of windshield portions are arranged at intervals in a third direction, the plurality of windshield portions protrudes from the mounting surface, the third direction is perpendicular to the first direction and the second direction respectively.

14. The electronic equipment of claim 8, wherein the heat dissipation device further comprises a connecting member arranged on the second shield, the connecting member is configured to detachably connect the second shield and the at least one power supply unit.

* * * * *